United States Patent
Kim et al.

(10) Patent No.: US 10,236,846 B2
(45) Date of Patent: Mar. 19, 2019

(54) POWER AMPLIFIER USING EQUIVALENT TRANSFORMER

(71) Applicant: Korea Electronics Technology Institute, Seongnam-si, Gyeonggi-do (KR)

(72) Inventors: Ki Jin Kim, Yongin-si (KR); Kwang Ho Ahan, Yongin-si (KR)

(73) Assignee: KOREA ELECTRONICS TECHNOLOGY INSTITUTE, Seongnam-si, Gyeonggi-do (KR)

( * ) Notice: Subject to any disclaimer, the term of this patent is extended or adjusted under 35 U.S.C. 154(b) by 0 days.

(21) Appl. No.: 15/894,675

(22) Filed: Feb. 12, 2018

(65) Prior Publication Data

US 2018/0248528 A1    Aug. 30, 2018

(30) Foreign Application Priority Data

Feb. 24, 2017    (KR) .......................... 10-2017-0024730

(51) Int. Cl.
| | |
|---|---|
| H01P 5/16 | (2006.01) |
| H03F 1/56 | (2006.01) |
| H03F 3/21 | (2006.01) |
| H03F 3/24 | (2006.01) |
| H03F 3/60 | (2006.01) |
| H03F 3/193 | (2006.01) |

(Continued)

(52) U.S. Cl.
CPC .............. *H03F 3/604* (2013.01); *H03F 1/565* (2013.01); *H03F 3/193* (2013.01); *H03F 3/21* (2013.01); *H03F 3/245* (2013.01); *H01P 5/16* (2013.01); *H03F 2200/255* (2013.01); *H03F 2200/451* (2013.01); *H04W 84/042* (2013.01); *H04W 84/12* (2013.01)

(58) Field of Classification Search
CPC ..... H01P 5/00; H01P 5/16; H03F 1/00; H03F 1/301; H03F 1/565; H03F 2200/00; H03F 2200/255; H03F 2200/372; H03F 2200/451; H03F 3/00; H03F 3/19; H03F 3/193; H03F 3/21; H03F 3/604; H03F 3/72; H03G 1/00; H03G 1/0088; H04W 84/00; H04W 84/042; H04W 84/12
USPC ....................................................... 327/560
See application file for complete search history.

(56) References Cited

U.S. PATENT DOCUMENTS

| | | | | |
|---|---|---|---|---|
| 2005/0007194 | A1* | 1/2005 | Grundlingh | H03F 1/0294 330/251 |
| 2008/0204134 | A1* | 8/2008 | Knickerbocker | H01P 5/16 330/124 R |

OTHER PUBLICATIONS

Huang et al., "A 17-35 GHz Broadband, High Efficiency PHEMT Power Amplifier Using Synthesized Transformer Matching Technique," (Jan. 2012) IEEE Transactions on Microwave Theory and Techniques, vol. 60, No. 1, pp. 112-119.

(Continued)

*Primary Examiner* — Lincoln D Donovan
*Assistant Examiner* — Dave Mattison
(74) *Attorney, Agent, or Firm* — Knobbe Martens Olson & Bear LLP (57) ABSTRACT

A power amplifier using an equivalent transformer is provided. The power amplifier includes amplifiers and T lines having first terminals connected to the amplifiers and second terminals connected to output sides. Accordingly, powers are combined using the equivalent transformer in the power amplifier, such that an insertion loss can be reduced and thus degradation of output power efficiency can be prevented.

4 Claims, 6 Drawing Sheets

(51) Int. Cl.
*H04W 84/04* (2009.01)
*H04W 84/12* (2009.01)

(56) References Cited

OTHER PUBLICATIONS

Office Action received in Korean Patent Application No. 10-2017-0024730, dated Feb. 8, 2018.

* cited by examiner

(Prior Art)

FIG.1

(Prior Art)

FIG.2

(Prior Art)

FIG.3

(Prior Art)

POWER AMPLIFIER USING EQUIVALENT TRANSFORMER

CROSS-REFERENCE TO RELATED APPLICATION(S) AND CLAIM OF PRIORITY

The present application claims the benefit under 35 U.S.C. § 119(a) to a Korean patent application filed in the Korean Intellectual Property Office on Feb. 24, 2017, and assigned Serial No. 10-2017-0024730, the entire disclosure of which is hereby incorporated by reference.

BACKGROUND

The present disclosure relates generally to a communication component-related technology, and more particularly, to a power amplifier which is used in communication components, modules, and systems for next-generation 5G mobile communication or WiFi.

SUMMARY

To address the above-discussed deficiencies of the prior art, it is a primary aspect of the present disclosure to provide a power amplifier using an equivalent transformer, which can prevent degradation of output power efficiency caused by an increased insertion loss.

According to one aspect of the present disclosure, a power amplifier includes: a first amplifier; a first T line which has a first terminal connected to the first amplifier, and a second terminal connected to an output side; a second amplifier; and a second T line which has a first terminal connected to the second amplifier, and a second terminal connected to an output side.

In addition, a third terminal of the first T line and a third terminal of the second T line may be connected to each other.

The third terminal of the first T line and the third terminal of the second T line may be grounded.

In addition, the first T line may be an equivalent circuit to a first transformer.

In addition, the second T line may be an equivalent circuit to a second transformer.

In addition, in the first T line, an impedance of a first line of the first terminal is L1-M, an impedance of a second line of the second terminal is L2-M, and an impedance of a third line of the third terminal is M, where L1 is an inductance of a primary coil of the first transformer, L2 is an inductance of a secondary coil of the first transformer, and M is a mutual inductance of the primary coil and the secondary coil.

In addition, the third terminal of the first T line and the third terminal of the second T line may be of a zigzag pattern.

The power amplifier may further include: a third amplifier; a third T line which has a first terminal connected to the third amplifier, and a second terminal connected to an output side; a fourth amplifier; and a fourth T line which has a first terminal connected to the fourth amplifier, and a second terminal connected to an output side.

In addition, the power amplifier may further include: a fifth T line which has a first terminal connected to the second terminal of the first T line and the second terminal of the second T line, and a second terminal connected to an output side; and a sixth T line which has a first terminal connected to the second terminal of the third T line and the second terminal of the fourth T line, and a second terminal connected to an output side.

According to another aspect of the present disclosure, a method for amplifying power includes: amplifying, by a first amplifier, a signal; amplifying, by a second amplifier, a signal; and combining, by a first T line and a second T line, the signal amplified by the first amplifier and the signal amplified by the second amplifier, wherein the first T line has a first terminal connected to the first amplifier and a second terminal connected to an output side, and the second T line has a first terminal connected to the second amplifier and a second terminal connected to an output side.

According to still another aspect of the present disclosure, a power combiner includes: a first T line having a first terminal connected to a first amplifier, and a second terminal connected to an output side; and a second T line having a first terminal connected to a second amplifier, and a second terminal connected to an output side.

According to yet another aspect of the present disclosure, a method for combining power includes: receiving, by a first T line having a first terminal connected to a first amplifier and a second terminal connected to an output side, a signal amplified by the first amplifier; receiving, by a second T line having a first terminal connected to a second amplifier and a second terminal connected to an output side, a signal amplified by the second amplifier; and combining, by the first T line and the second T line, the signal amplified by the first amplifier and the signal amplified by the second amplifier.

According to various embodiments described above, powers are combined using the equivalent transformer in the power amplifier, such that an insertion loss can be reduced and thus degradation of output power efficiency can be prevented.

In particular, the above-described method may be applied to a millimeter wave high power amplifier to be used in next-generation mobile communication, and can greatly contribute to enhancing performance by increasing power efficiency of the millimeter amplifier, and to reducing the whole area of a chip.

Other aspects, advantages, and salient features of the described technology will become apparent to those skilled in the art from the following detailed description, which, taken in conjunction with the annexed drawings, discloses embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the FIG. 1 is a view showing a PA output structure using a Wilkinson combiner.

DETAILED DESCRIPTION

Figure 1:
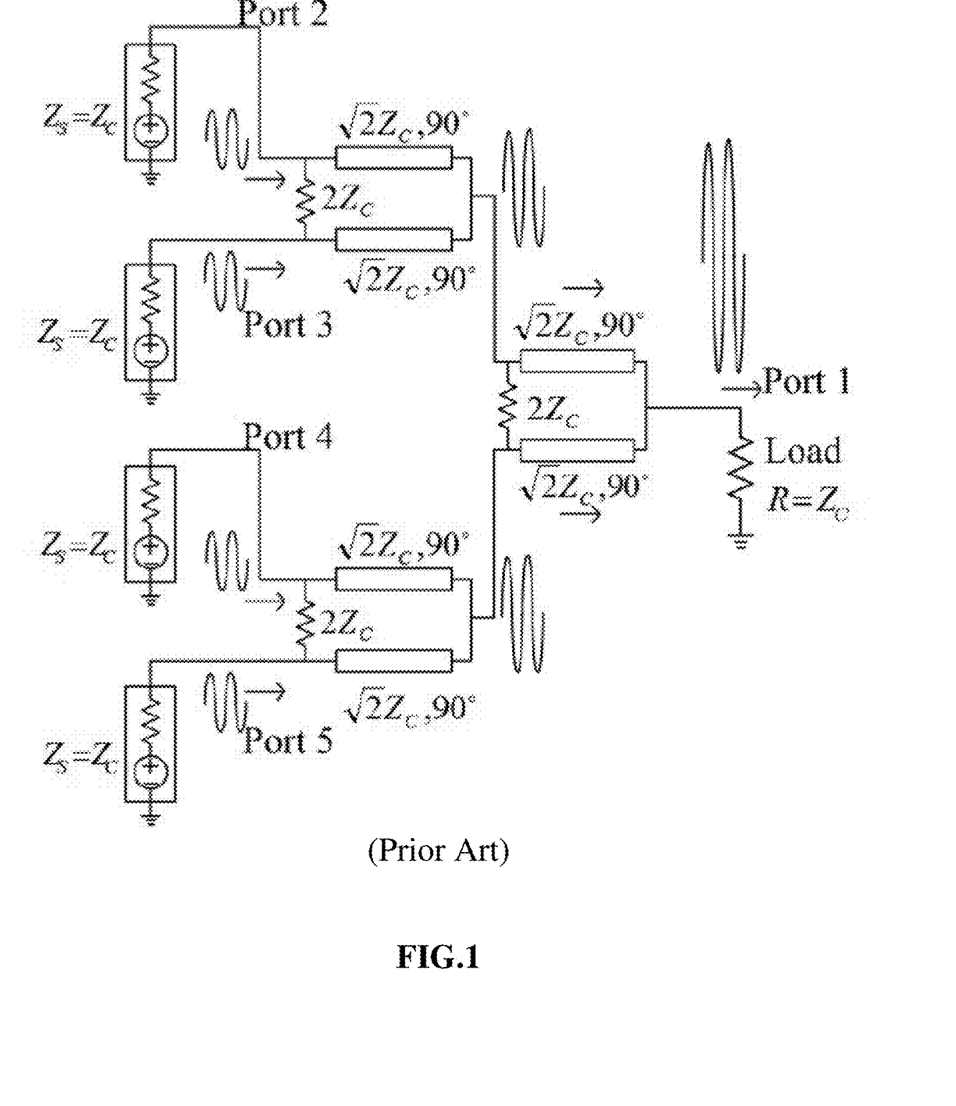

FIG. 1 shows an output power combining structure of a high power amplifier (PA). In FIG. 1, Port 1 indicates a power amplifier port outputting a signal to an antenna, and Ports 2-5 indicate output ports of individual PAs forming the PA.

To obtain a radio frequency (RF) PA, high power is made by combining output powers of individual PAs. The method of connecting Wilkinson combiners in series as shown in FIG. 1 is the easiest method for making a high power amplifier.

The Wilkinson combiner is formed of a transmission line having a wavelength of λ/4, and has such a size that it is difficult to implement in a normal chip. In addition, as operating frequencies of recent chips increase, designing the Wilkinson combiner in chips may cause an insertion loss problem.

When outputs of two individual PAs are combined by the Wilkinson combiner, there is an effect of increasing 3 dB output power, but, when a great insertion loss is caused, the effect of combining power may be degraded. Therefore, there is a problem that high power may not be obtained even when Wilkinson combiners are connected by cascade by connecting their terminals to one another.

Figure 2:
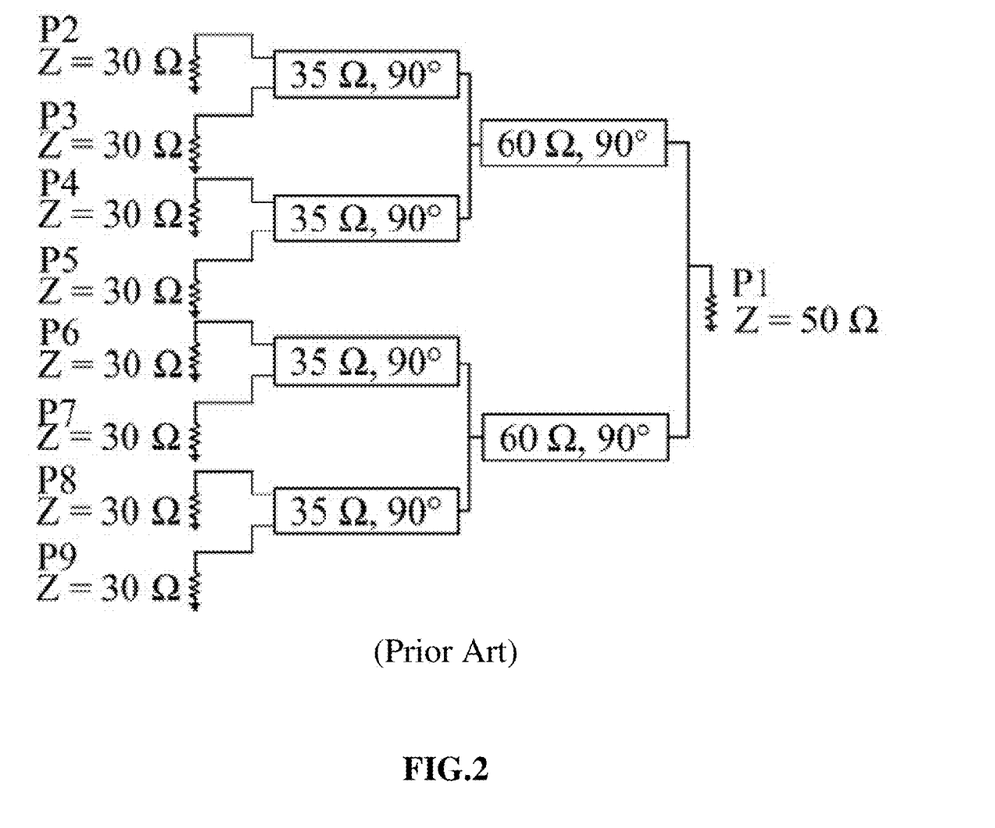
FIG. 2 is a view showing a bus bar type power combining structure.

FIG. 2 illustrates a power amplifier matching structure for combining powers in a bus bar type. This structure combines powers of two individual PAs by utilizing λ/4 wavelength transmission lines having characteristic impedances, which can be matched each other.

This structure may cause less insertion loss and may require a smaller consumption area for the transmission line, in comparison to the Wilkinson structure, and thus is used the most for combining high powers in chips. However, this structure may also have degraded efficiency due to an insertion loss that is caused by connecting lines of a λ/4 wavelength by cascade. In addition, most of the chip areas are used for a matching circuit and thus there is a need to complement the structure.

Figure 3:
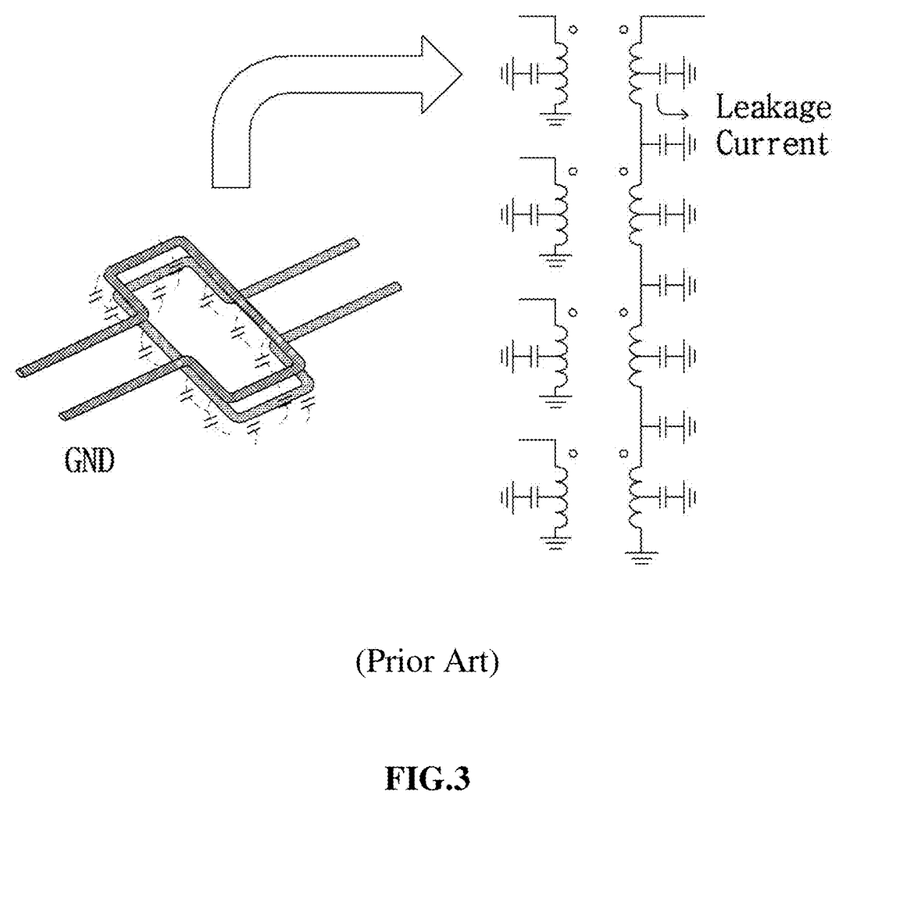
FIG. 3 is a view showing a power combining structure using a transformer.

FIG. 3 illustrates a power amplifier matching structure for combining voltages using a transformer. Compared to a related-art matching circuit using a λ/4 wavelength, this structure has advantages of a small matching circuit size and insertion loss enhancement by using a small transformer.

However, as shown in FIG. 3, the degree of coupling voltages varies according to a position of a transformer due to a leakage current caused by a parasitic capacitor, and as a result, this leads to an increased insertion loss and degradation of output power efficiency.

Hereinafter, the present disclosure will be described in detail with reference to the accompanying drawings.

In order to solve a problem of power efficiency degradation, caused by parasite capacitance in a power combiner using a transformer having an advantage of a small size, embodiments of the present disclosure suggest a power amplifier having a structure of combining powers using T-lines which are equivalent to a transformer.

Figure 4:
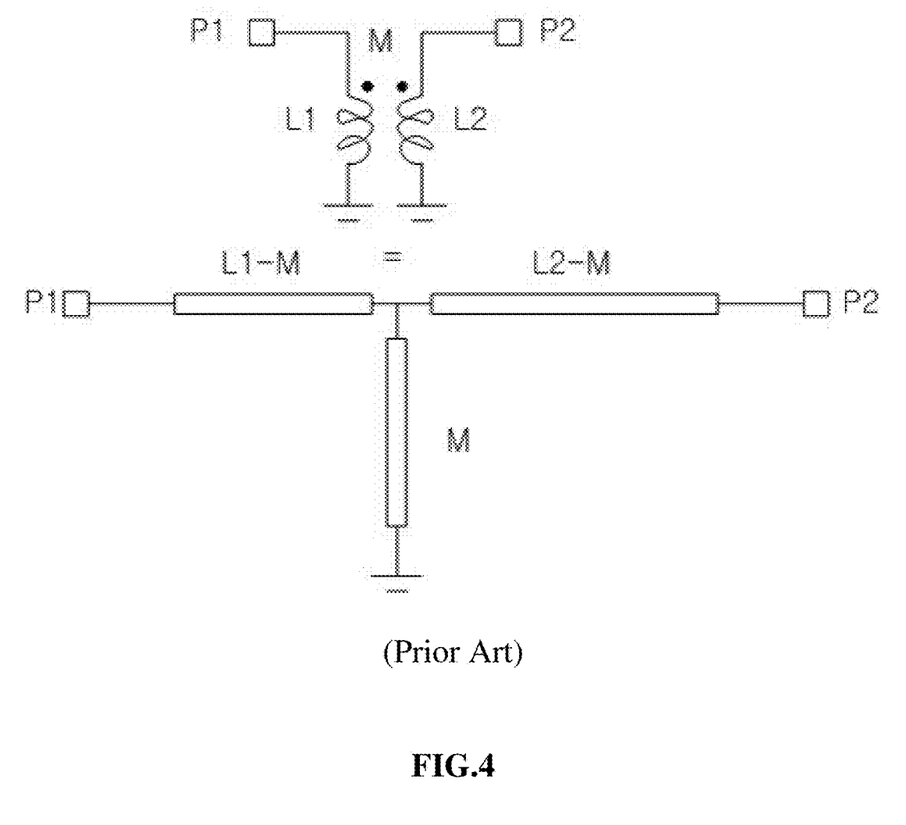
FIG. 4 is a view showing a T-line transformer equivalent circuit.

FIG. 4 is a view showing a T-line equivalent circuit of a transformer. Specifically, the upper portion of FIG. 4 illustrates a circuit diagram which models a transformer, and the lower portion illustrates a T-line circuit which is an equivalent circuit of the upper circuit.

Parameters indicating characteristics of the transformer may include L1 and L2 values for matching, and an M value which is a mutual coupling factor, which is referred to as coupling. L1 is an inductance of a primary coil of the transformer, L2 is an inductance of a secondary coil of the transformer, and M is a mutual inductance of the primary coil and the secondary coil.

Figure 5:
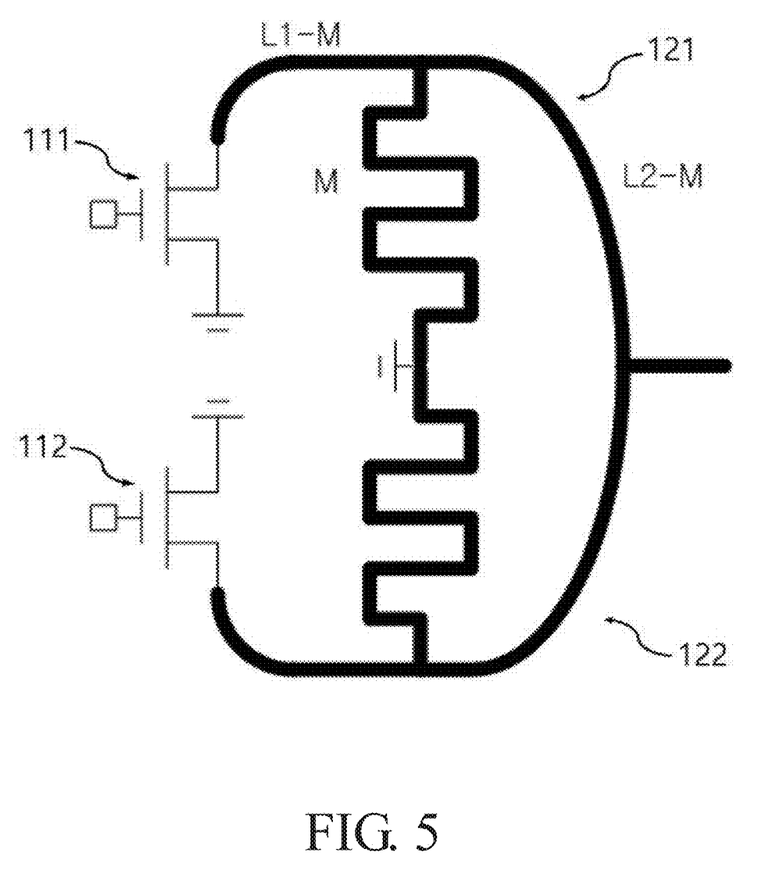
FIG. 5 is a circuit diagram of a two-stage power amplifier using T-lines.

Hereinafter, a power amplifier using the T-line equivalent circuit illustrated in the lower portion of FIG. 4 will be described in detail with reference to FIG. 5. FIG. 5 is a circuit diagram of a power amplifier using T-lines.

As shown in FIG. 5, the power amplifier according to an exemplary embodiment includes an amplifier #1 111, an amplifier #2 112, a T-line #1 121, and a T-line #2 122.

Herein, the T-line #1 121 and the T-line #2 122 form a power combiner. That is, the T-line #1 121 and the T-line #2 122 may combine a signal amplified at the amplifier #1 111 and a signal amplified at the amplifier #2 112, and may transmit the combined signal to an output terminal connected with an antenna, while performing impedance matching with the amplifier #1 111 and the amplifier #2 112.

The T-line #1 121 is an equivalent circuit to a transformer #1, wherein an impedance of a line-1 at a terminal-1 is L1-M, an impedance of a line-2 at a terminal-2 is L2-M, and an impedance of a line-3 at a terminal-3 is M. Herein, L1 is an inductance of a primary coil of the transformer #1, L2 is an inductance of a secondary coil of the transformer #1, and M is a mutual inductance of the primary coil and the secondary coil.

The T-line #2 122 is an equivalent circuit to a transformer #2, wherein an impedance of a line-1 at a terminal-1 is L1-M, an impedance of a line-2 at a terminal-2 is L2-M, and an impedance of a line-3 at a terminal-3 is M. Herein, L1 is an inductance of a primary coil of the transformer #2, L2 is an inductance of a secondary coil of the transformer #2, and M is a mutual inductance of the primary coil and the secondary coil.

The T-line #1 121 has the terminal-1 connected to the amplifier #1 111, and the terminal-2 connected to the output terminal. The T-line #2 122 has the terminal-1 connected to the amplifier #2 112, and the terminal-2 connected to the output terminal.

In addition, the terminal-3 of the T-line #1 121 and the terminal-3 of the T-line #2 122 are connected to each other and are grounded.

The high-output individual amplifiers 111, 112 should be arranged to be spaced apart from each other by a physical distance due to a heat problem, etc. of the transistor, and a line connecting these amplifiers may be included in a matching circuit formed by the T-lines 121, 122 and thus an additional insertion loss caused by interconnection can be solved.

That is, a leakage current problem caused by a parasitic capacitor, which is a disadvantage of a power combiner using a transformer, may not occur when the transformer is converted into a T-line which is an equivalent circuit as shown in FIG. 5, and a loss which may be caused when powers are combined can be minimized.

In addition, a line length that is required to implement L1, L2, and M values necessary for matching is shorter than that in the Wilkinson combiner or the bus bar type power combining structure, and thus a loss caused when powers are combined can be minimized. This may greatly influence reduction of a size of the whole power amplifier.

As the M value increases, efficiency of transferring power using the transformer increases. However, there is a limit to increasing the M value in the transformer implemented in a chip. However, in the power amplifier according to an exemplary embodiment shown in FIG. 5, the M value may be freely changed, and in particular, the M value may be freely increased, and thus a more favorable condition can be easily set when powers are combined.

In particular, the lines-3 (M) of the T-line #1 121 and the T-line #2 122 may be formed in a zigzag pattern, such that the length of the line-3 can be increased in a small area and thus the M value can be increased.

In addition, the line-1 (L1-M) and the line-2 (L2-M) are lines to be connected to the amplifiers 111, 112, and the output terminals, respectively, and the total length of the T-line is even shorter than λ/4. Therefore, when powers are combined using the T-line, a low insertion loss can be ensured with the effect of combining small powers.

Figure 6:
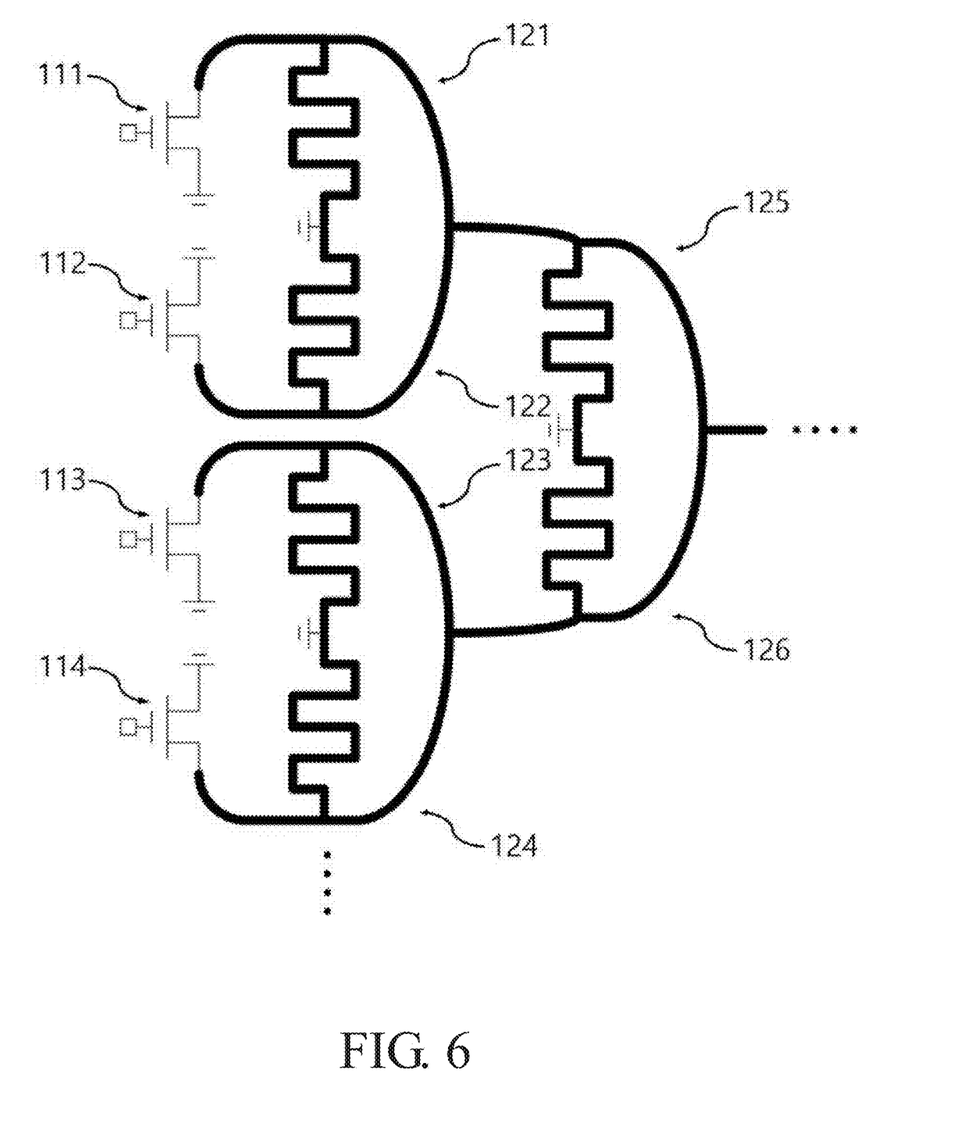
FIG. 6 is a circuit diagram of an N-stage power amplifier using T-lines.

In the power amplifier described above, powers are combined in two stages. However, power combining may be extended to N-stage power combining, and a relevant structure is suggested in FIG. 6. FIG. 6 is a circuit diagram of a power amplifier for combining powers in N stages with T-line equivalent circuits.

As shown in FIG. 6, the power amplifier according to an exemplary embodiment includes an amplifier #1 111, an amplifier #2 112, an amplifier #3 113, an amplifier #4 114, a T-line #1 121, a T-line #2 122, a T-line #3 123, a T-line #4 124, a T-line #1 125 and a T-line #6 126.

The power combined by the T-line #1 121 and the T-line #2 122, and the power combined by the T-line #3 123 and the T-line #4 124 are combined again by the T-line #5 125 and the T-line #6 126. In this way, a structure expanded to have N number of amplifiers connected may be provided.

As described above, since an insertion loss can be reduced with a small size and a short length, it is advantageous to combine powers, and also, since parameters of the transformer for matching may be changed diversely while combining powers, there is a freedom to combine power with a wider band than in related-art methods.

Up to now, the power amplifier using the equivalent transformer has been described with reference to preferred embodiments.

According to various embodiments, powers are combined using the equivalent transformer in the power amplifier, such that degradation of output power efficiency caused by an increased insertion loss can be prevented, and in particular, the above-described method may be applied to a millimeter wave high power amplifier to be used in next-generation mobile communication, and can greatly contribute to enhancing performance by increasing power efficiency of the millimeter amplifier, and to reducing the whole area of a chip.

Furthermore, the power amplifier according to embodiments can be applied to a 5G mobile communication front end module, which is being prepared as next-generation mobile communication, and a next-generation Gbps WiFi front end module which is high-speed WiFi.

The technical concept of the present disclosure can be applied to a power combiner forming the power amplifier.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A power combiner comprising:
a first amplifier;
a second amplifier;
a first transformer connected to the first amplifier; and
a second transformer connected to the second amplifier and further connected to the first transformer circuit to combine an output of the first amplifier and an output of the second amplifier,
wherein the first transformer is equivalent to a first T-line circuit comprising a first junction, a first terminal connected to the first junction via a first line, a second terminal connected to the first junction via a second line and a third terminal connected to the first junction via a third line,
wherein the second transformer is equivalent to a second T-line circuit comprising a second junction, a fourth terminal connected to the second junction via a fourth line, a fifth terminal connected to the second junction via a fifth line and a sixth terminal connected to the second junction via a sixth line,
wherein (1) an output terminal of the first amplifier is connected to the first terminal of the first T-line circuit, (2) an output terminal of the second amplifier is connected to the fourth terminal of the second T-line circuit, (3) the second terminal of the first T-line circuit and the fifth terminal of the second T-line are connected to an output terminal of the power combiner, and (4) the third terminal of the first T-line circuit and the sixth terminal of the second T-line are connected to a common ground such that the output of the first amplifier and the output of the second amplifier are combined at the output terminal of the power combiner.

2. The power combiner of claim 1, wherein, an impedance of the first line is L1-M, an impedance of the third line is L2-M, and an impedance of the second line is M, where L1 is an inductance of a primary coil of the first transformer, L2 is an inductance of a secondary coil of the first transformer, and M is a mutual inductance of the primary coil and the secondary coil.

3. The power combiner of claim 1, wherein the third terminal of the first T-line circuit and the six terminal of the second T-line circuit are of a zigzag pattern.

4. A power combiner for combining outputs of two amplifiers comprising:
a first transformer connected to the first amplifier; and
a second transformer connected to the second amplifier and further connected to the first transformer circuit to combine an output of the first amplifier and an output of the second amplifier,
wherein the first transformer is equivalent to a first T-line circuit comprising a first junction, a first terminal connected to the first junction via a first line, a second terminal connected to the first junction via a second line and a third terminal connected to the first junction via a third line,
wherein the second transformer is equivalent to a second T-line circuit comprising a second junction, a fourth terminal connected to the second junction via a fourth line, a fifth terminal connected to the second junction via a fifth line and a sixth terminal connected to the second junction via a sixth line, wherein (1) an output terminal of the first amplifier is connected to the first terminal of the first T-line circuit, (2) an output terminal of the second amplifier is connected to the fourth terminal of the second T-line circuit, (3) the second terminal of the first T-line circuit and the fifth terminal of the second T-line are connected to an output terminal of the power combiner, and (4) the third terminal of the first T-line circuit and the sixth terminal of the second T-line are connected to a common ground such that the output of the first amplifier and the output of the second amplifier are combined at the output terminal of the power combiner.

* * * * *